United States Patent [19]

Zasio et al.

[11] Patent Number: 4,504,783
[45] Date of Patent: Mar. 12, 1985

[54] TEST FIXTURE FOR PROVIDING ELECTRICAL ACCESS TO EACH I/O PIN OF A VLSI CHIP HAVING A LARGE NUMBER OF I/O PINS

[75] Inventors: John Zasio, Sunnyvale; Dwight Elvey, Santa Cruz; Ronald Tanizawa, San Jose, all of Calif.

[73] Assignee: STORAGE Technology Partners, Louisville, Colo.

[21] Appl. No.: 429,898

[22] Filed: Sep. 30, 1982

[51] Int. Cl.³ .............................................. G01R 15/12
[52] U.S. Cl. ................................ 324/73 R; 324/158 F
[58] Field of Search ............ 324/73 R, 73 AT, 158 F, 324/158 R

[56] References Cited

U.S. PATENT DOCUMENTS

| | | | |
|---|---|---|---|
| 3,492,572 | 1/1970 | Jones et al. | 324/73 R |
| 3,651,401 | 3/1972 | Cooney | 324/158 F |
| 4,216,539 | 8/1980 | Raymond et al. | 324/73 R |
| 4,335,457 | 6/1982 | Early | 324/73 R |
| 4,339,819 | 7/1982 | Jacobson | 324/73 R |
| 4,441,075 | 4/1984 | McMahon | 324/73 R |

*Primary Examiner*—Gerard R. Strecker
*Assistant Examiner*—Warren S. Edmonds
*Attorney, Agent, or Firm*—Bryant R. Gold

[57] ABSTRACT

A VLSI chip tester for defining and performing functional tests, delay tests, and DC parametric tests on VLSI chips. The VLSI chip under test is mounted to a paddle card which, in turn, is detachably held under pressure against a circuit board mounted in a test fixture. A connector is sandwiched between the paddle card and circuit board. The connector has insulated, spaced-apart conductors that are orthogonal to the paddle card and circuit board, and that provide electrical contact between each pin of the VLSI chip under test and a corresponding pad on the circuit board. Shift register circuits mounted to the circuit board provide a single stage corresponding to each I/O pin of the device under test. Each stage may function as an input or output device. A computer or computers are coupled to the shift register circuits through appropriate cabling and driver/receiver/termination circuits. Test data to be sent to or from the computer may be shifted serially into or out of the shift register circuits. Similarly, test data to be sent to or from the device under test may be shifted in parallel into or out of the shift register circuits. A self-test capability is provided.

9 Claims, 11 Drawing Figures

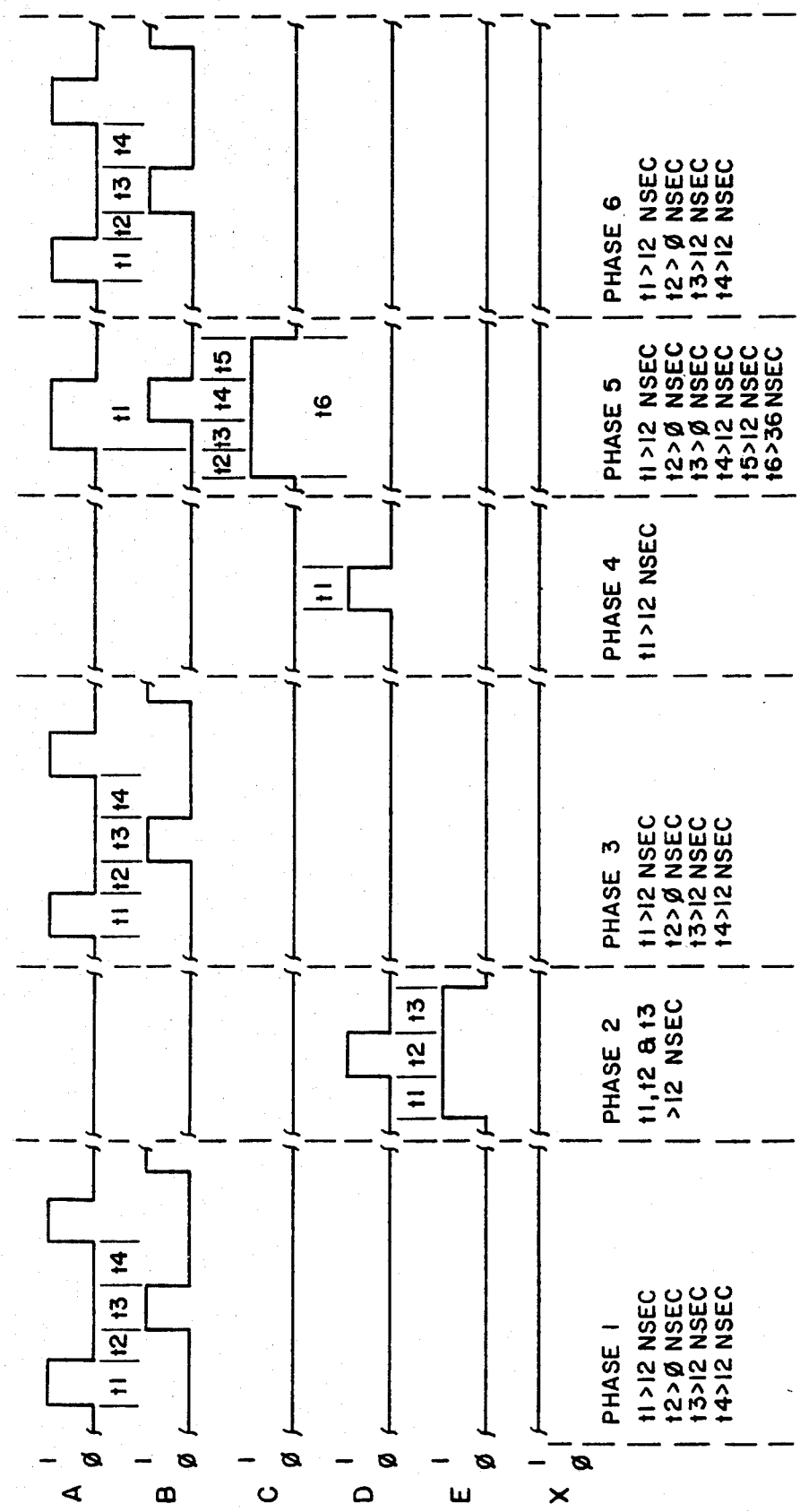

TEST FIXTURE FOR PROVIDING ELECTRICAL ACCESS TO EACH I/O PIN OF A VLSI CHIP HAVING A LARGE NUMBER OF I/O PINS

BACKGROUND OF THE INVENTION

This invention relates to the testing of integrated circuits, and more particularly to the testing of very large scale integration (VLSI) integrated circuits. Specifically, this invention relates to the testing of complementary metal oxide semiconductor (CMOS) VLSI chips after they have been packaged in a semiconductor package.

Testing a packaged integrated circuit chip requires that three types of tests be performed; functional test, delay test and DC parametric test.

Functional test consists of applying a predetermined pattern of logical ones and zeros on the input pins of the package, applying a clock pulse, if necessary, on the clock input pin, and reading the chip's response on the output pins of the package. The response will be a pattern of logical ones and zeros which can be compared to the expected result to determine if the chip functioned properly. In general, attempts are made to generate enough tests to test all of the functional circuitry of the chip.

Delay testing consists of applying pulses, or logical transitions, of very fast rise times on selected input pins and measuring the time required for the response to appear at the output. Since the number of circuits in the path through the chip is known, the average circuit delay can be calculated. Typically, enough different paths are delay tested to give a high confidence that all the circuits on the chip will operate at the required speed.

DC parametric testing consists of measuring the electrical parameters of the chip's circuits connected to the input and output (I/O) pins. This is done by forcing a voltage or a current into an I/O pin, depending upon whether the I/O pin is an input or an output, respectively, and measuring the current or voltage, respectively, at the I/O pin.

Testers to perform the tests described above have been in use for years. The general concept is a connection between each signal pin on the chip package and the tester. The tester connections to the chip pins are typically bi-directional so that they can be used to test either an input or output pin on the chip. The tester controller, quite often a programmable computer, controls the operation of the tester. Transfers between the tester and the device under test (DUT) during functional tests are performed in a broadside manner. That is, all of the input pins of the DUT receive a test signal at the same time, and all the outputs of the DUT are read at the same time. Therefore, the tester controller has to load the correct input test pattern into the correct latches corresponding to the chip's input pins prior to the broadside load and read the data from the correct latches corresponding to the chip's output pins.

As integrated circuit technology has progressed to what is now called VLSI, the number of I/O pins necessary on a chip to allow use of the added circuitry, has increased also. Integrated circuit packages with up to 256 pins may now be used to package VLSI chips, and this has caused VLSI testers to become very large and very expensive.

As circuit densities have increased, special attention must be given to the testability of the chip. One approach to provide testability has been to design chips such that all the internal registers can be connected together as a shift register. This concept, disclosed in copending patent application Ser. No. 332,866, filed 12-21-81, now abandoned, assigned to a common assignee, allows a tester to shift data into the internal registers for use during test. This concept greatly speeds up functional testing since it allows the tester to set conditions within the chip as well as at the input pins and makes each test independent of the previous test. Previous testers could not take advantage of this feature since they perform a parallel load instead of a serial shift of data.

Connectors on the testers typically use "pogo-pin" contacts. These are spring-loaded, telescoping, contacts with a pointed or cupped end, arranged in the same pattern as the pins on the DUT. When the DUT is aligned over the connector, a small force is applied to partially compress the pogo-pins. The spring within the pogo-pin resists this force and causes the pogo-pin to make contact with the pin on the DUT. Pogo-pins are easily damaged and or contaminated, and quite often will remain depressed. This causes either no connection or intermittent connection on subsequent tests.

SUMARY OF THE INVENTION

The object of the present invention is to improve the testers used in the testing of packaged CMOS integrated circuits. In particular, it is an object of the present invention to provide a tester that allows functional tests, parametric tests, and delay tests to be efficiently and accurately performed on a VLSI chip.

It is a further object of the present invention to provide such a tester that is computer controlled so that a large number of tests and test data can be quickly and accurately performed and evaluated.

It is another object of the present invention to provide such a tester that can interface, along with several other such testers, with a large general purpose computer having high data storage capacity, thereby reducing the cost of the tester by eliminating the need for mass storage means to be included within each tester.

Still a further objective of the present invention is to provide a test fixture wherein electrical contact may be quickly and consistenly made with each of the reletively large number of pins associated with VLSI circuitry without the need for using spring loaded "pogo-pin" type contacts.

An additional object of the present invention is to provide a test fixture that can be completely self tested.

In general, the invention accomplishes the above and other objects of the invention by a design which includes a large general purpose computer (to which several testers may be connected), a small general purpose computer, controller cards connected to the small computer, and a test head.

The test head connects the device under test (DUT), i.e., the packaged chip, to a printed circuit board containing serial-parallel multiplexer (SPM) chips, line drivers, and line receivers. The SPM chips are specifically designed for use on the tester and may use a subset of the same master-slice as used by the chips being tested.

Each SPM is a shift register and each stage of the shift register can be programmed to be either an input or an output. The shift register stages are wired to the pins of the test head into which the DUT is mounted for testing.

The design of the tester advantageously allows it to perform functional tests, parametric tests, and delay tests on the DUT. The design allows a parallel load of the functional test pattern, held in the shift registers of the SPM chips, into the input pins of the DUT. The design also allows a parallel read from the output pins of the DUT into the shift register of the SPM.

The design further allows for the shifting of test data into the internal registers of the DUT, after programming them to function as a single shift register, thus allowing test conditions to be set within the DUT. This feature, along with the parallel load feature, greatly reduces the number of tests required to functionally test the DUT.

The tester utilizes a unique connector design, discussed later, to make electrical connection to the DUT. This design simplifies the alignment problem and eliminates the problems encountered with the "pogo-pin" type contacts used on previous testers. In addition, the tester tests all pins, by forcing a current and measuring the voltage, to ensure there is correct contact before performing any other tests.

The design is very versatile in that chips with any number of pins can be tested by simply changing the connector and adding more SPM chips if necessary.

The overall concept and design of the tester, especially the SPM chips, greatly reduces the complexity, size, and cost of a tester required to test packaged CMOS VLSI chips. Furthermore, the tester is configured in such a way that it can be fully self-tested in a very short time.

BRIEF DESCRIPTION OF THE DRAWINGS

The above and other objects, features, and advantages of the present invention will be better understood by reference to the accompanying drawings, wherein:

FIG. 9 is a timing diagram; and

DESCRIPTION OF THE PREFERRED EMBODIMENT

The following is a description of the best presently contemplated mode of carrying out the invention. The description is not to be taken in a limiting sense and it is made merely for the purpose of describing the general principles of the invention. The scope of the invention should be determined with reference to the appended claims.

Figure 1:
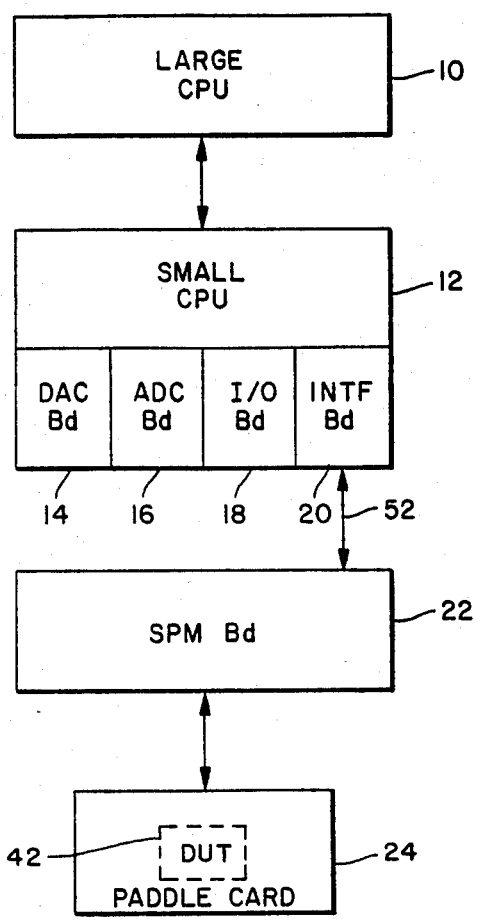
FIG. 1 is a block diagram showing the major components of the tester.

Referring to FIG. 1, the present invention consists of a large computer 10, a small computer 12 into which four special printed circuit boards 14–20 are inserted, and the serial-parallel multiplexer (SPM) printed circuit board 22. Also shown for reference is the device under test (DUT) 42 mounted on a paddle card 24. The large computer 10 is a modern, high speed computer system with hundreds of megabytes of on-line disk or other storage. It is on this computer system that the test parameters, e.g., input and output pin assignments, input and output patterns for functional test, parametric values, etc., are generated and stored. The small computer, under operator control, causes the test parameters to be transferred from the large computer, causes the test to be performed, and causes the transfer of the results of the test to the large computer for storage. This concept advantageously reduces the cost of the tester by eliminating the need for mass-storage devices and allows a number of testers to be connected to the large computer 10 at the same time.

The digital to analog converter (DAC) printed circuit board 14, under control of the small computer 12, generates a voltage or current used during the DC parametric test. The analog to digital covnerter (ADC) printed circuit board 16, under control of the small computer 12, converts the analog voltage or current that results from a DC parametric test into a digital word for the small computer 12 to read. If a voltage is being measured, it is measured, through the tester wiring, at the point of origin. If a current is being measured, it is measured as a voltage drop across a precision resistor on the interface (INTF) printed circuit board 20. The input/output (I/O) printed circuit board 18 has I/O ports which provide parallel word communications between the I/O bus of the small computer and the INTF printed circuit board 20. The interface (INTF) printed circuit board 20 is the main interface between the SPM printed circuit board and the rest of the tester.

Figure 2:
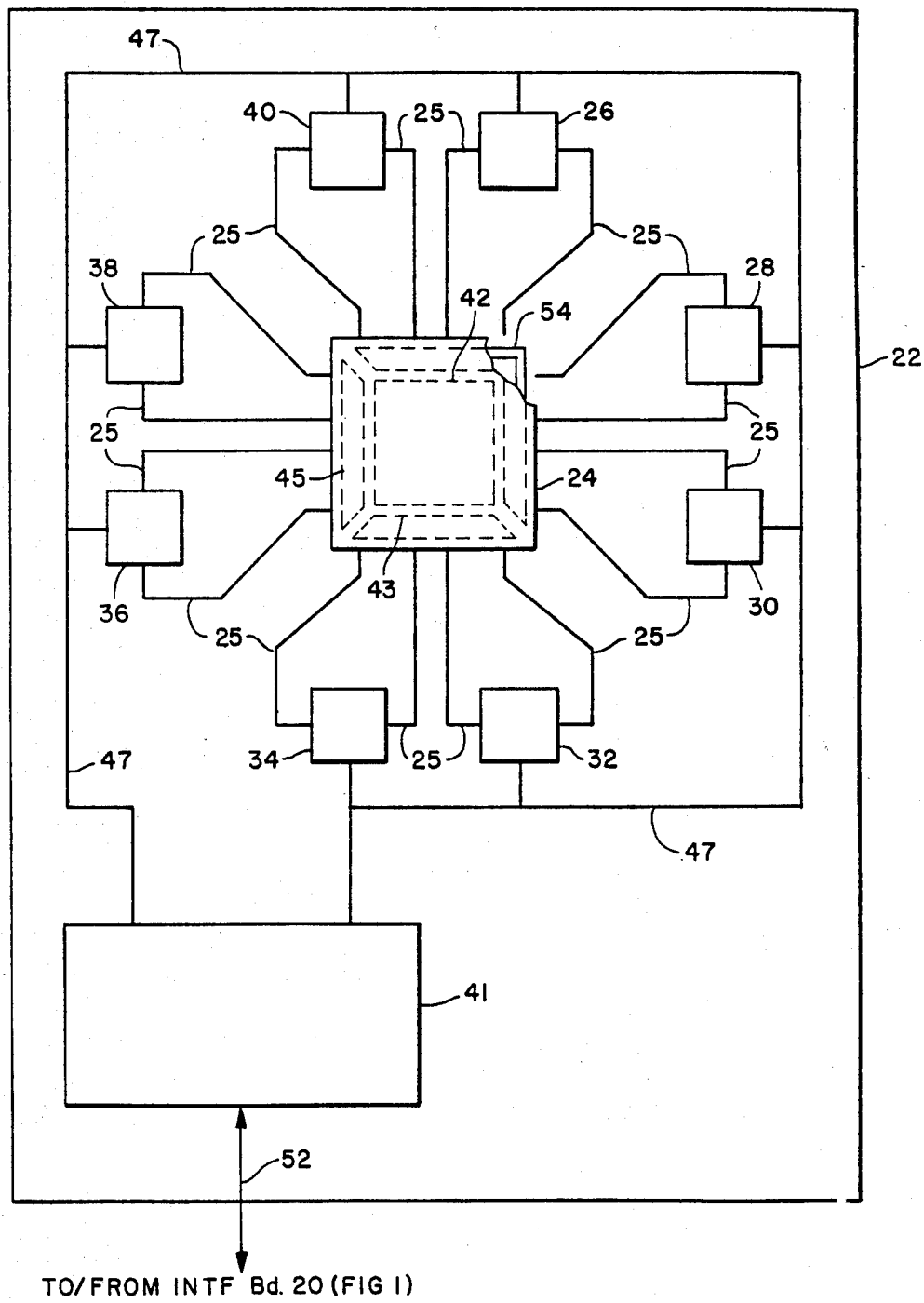
FIG. 2 is a top plan view of the serial-parallel multiplexer (SPM) card used by the present invention showing the location of the SPM chips and the device under test (DUT)

FIG. 2 is a top plan view of the SPM printed circuit board assembly 22, including the paddle card 24. A portion of the paddle card 24 is broken away in order to show the connector 54 that connects the paddle card 24 to the SPM card 22. In the preferred embodiment, eight serial-parallel multiplexer (SPM) chips 26–40 surround the device under test (DUT) 42, which is (for convenience of handling) mounted on a paddle card 24. Each SPM contains a 32-bit shift register. Typically, the DUT has 256-pins; 24-pins are dedicated to voltage and ground connections, 7-pins are wired to special built-in test pads, and 225 may be either input or output pins. The eight SPMs are wired to form a 256-bit shift register with 225-stages of the shift register wired, through line traces (shown as single lines 25 in FIG. 2) on the SPM printed circuit board 22, to the test head connector 54, to which the paddle card 24 contacts, in the center of the SPM printed circuit board. This connects a shift register stage to each of the possible 225 I/O pins of the DUT. All electrical signals to or from the DUT 42 pass through the SPMs 26–40. The receivers, drivers, and terminators 41, interface the SPM chips to the INTF printed circuit board 20 (FIG. 1) through the cable 52. The receivers receive and buffer signals from the INTF board 20, and the drivers send signals from the SPM board to the INTF board 20. The terminators provide the proper electrical termination for the signal cable between the INTF and SPM boards 20 and 22 respectively. Line traces (shown as single lines 47 in FIG. 2) connect the receivers, drivers, and terminators 41 to the various SPM chips 26–40.

Figures 3, 3A:
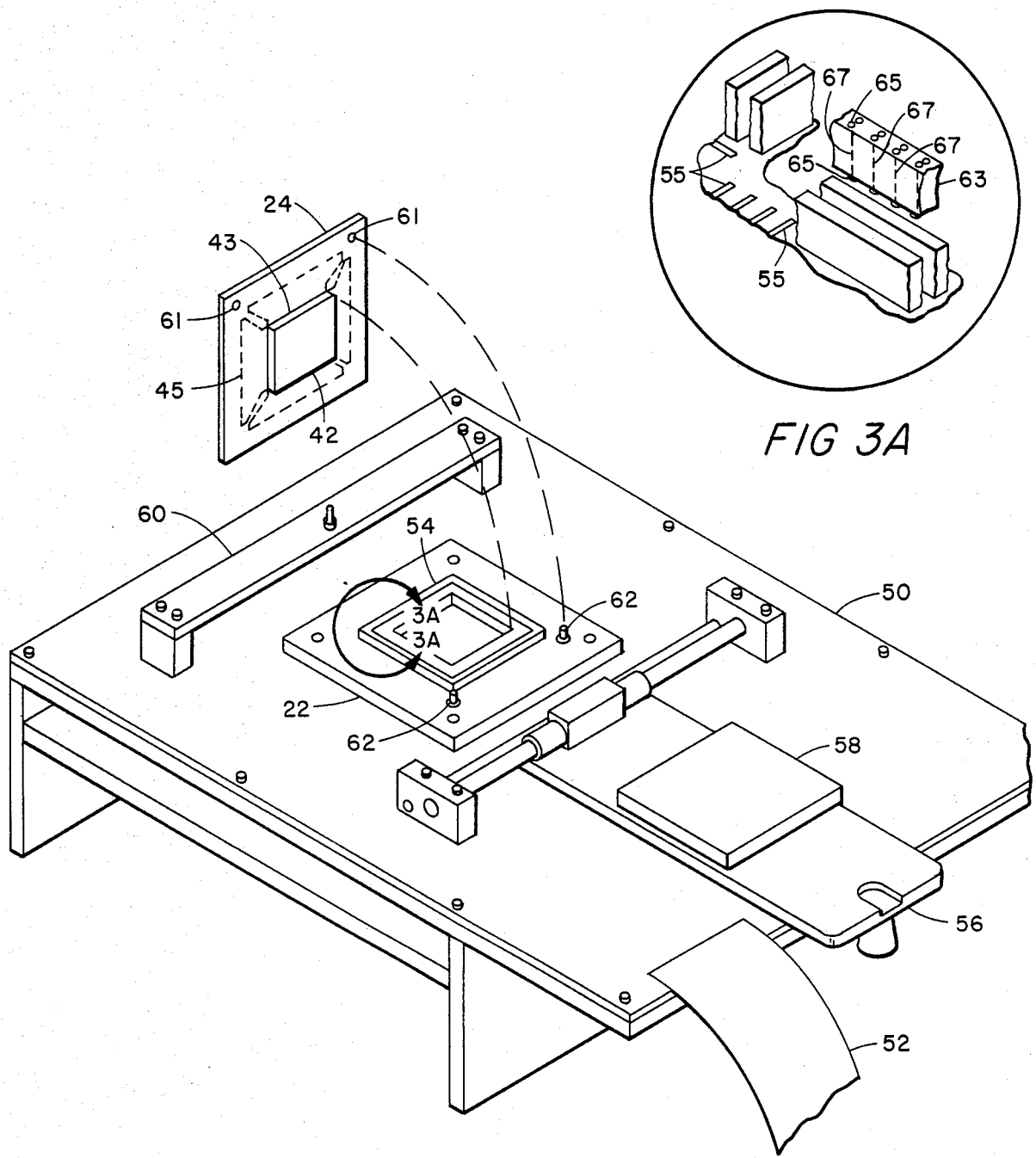
FIG. 3 is a perspective view showing the main features of one embodiment of the test fixture.
FIG. 3A is an exploded view of a section of FIG. 3.

FIG. 3 is a perspective view of the test fixture. The paddle card 24 is approximately four inches square with the trace pattern etched on one side and a copper plane of the reverse side. Two holes 61 are precisely located to align the paddle card with guide pins 62 in the test head 54. The inner square of the trace pattern 43 has traces that are typically ten-mils wide, separated by approximately a ten-mil space. There are 64-traces on each side of the square, separated into two groups of 32-traces each. This pattern on the inside square of the trace pattern 43 agrees exactly with the pattern of the pins on the integrated circuit package of the DUT 42. The pins of the integrated circuit package are lap-soldered to the 256-traces forming the inner square 43. The traces of the inner square 43 fan out to the pads forming the outer square 45. These pads are typically twenty-mils wide and are typically seperated by a twenty-mil space. These pads agree with the position of the 256-connector points of the test head connector 54 in the center of the SPM printed circuit board 22 of the test fixture.

An integrated circuit package 42, the DUT, is shown soldered to the paddle card 24. The package is soldered to the paddle card shortly after the chip is packaged and remains on the paddle card until it is removed and soldered to a chip carrier module (CCM). The paddle card serves two important functions: (1) it allows the packaged chip to be handled and stored without damage to the delicate leads of the package and (2) it provides a means of connecting the package to the tester.

The test fixture consists of a metal frame 50 on which the SPM printed circuit board 22 is mounted. The SPM board has the test head connector 54 in the center and two guide pins 62. When the alignment holes 61 of the paddle card 24 are placed on the alignment pins 62 with the DUT 42 down (inside the square test head connector 54), the outside square of pads 45 on the paddle card make contact with the connector. A mechanical lid 56 with a pressure plate 58 is closed over the paddle card and locked in place in the locking bracket 60. When closed, the mechanical lid applies approximately thirty pounds of force on the paddle card. This force assures good electrical contact between the connector in the test head and the contacts of the paddle card.

Electrical connection between the pads of the paddle card and the SPM printed circuit board is made through a unique connector design. Strips of silicone rubber, typically 50 mils wide, with two rows of five-mil diameter silver plated wires 67 spaced vertically every 10-mils along the strip are inserted into the test head connector 54. A portion of this strip of silicone rubber is illustrated in FIG. 3A, as 63, shown removed from the head connector 54. The wires are sealed in the silicone rubber with the corresponding tips 65 of each wire exposed so that they can make electrical contact. This material is commercially available from Tecknit Corporation of Cranford, N.J., as their ZEBRA, Series 5000 contact strip. It's commercial application is different than the use proposed by the present invention.

Strips of this material, of the appropriate length, are placed in receiving channels along the four sides of the square channel of the test head 54. A portion of the test head 54 is shown cut away in FIG. 3A in order to show the plated pads 55 of the SPM circuit board 22. When the pressure plate is closed and locked, the material deforms slightly and the wires make good electrical contact with the metal plated pads of the SPM printed circuit board 22 and the corresponding plated pads on the paddle card 24. The wire spacing within the silicone rubber virtually guarantees correct pad-to-pad connection. This connector design eliminates the "pogo-pin", normally used on testers of this type, which are inherently mechanically unreliable. Since the strip is not mechanically attached to anything, replacement consists of lifting out the defective strip and dropping in the new strip.

Electrical connections between the SPM printed circuit board 22 and the INTF board 20 in the small computer are made by means of the cable 52. A fan, not shown in the figure, may be used to provide one-hundred cubic feet of air per minute to cool the DUT while it is being tested.

Figure 4:
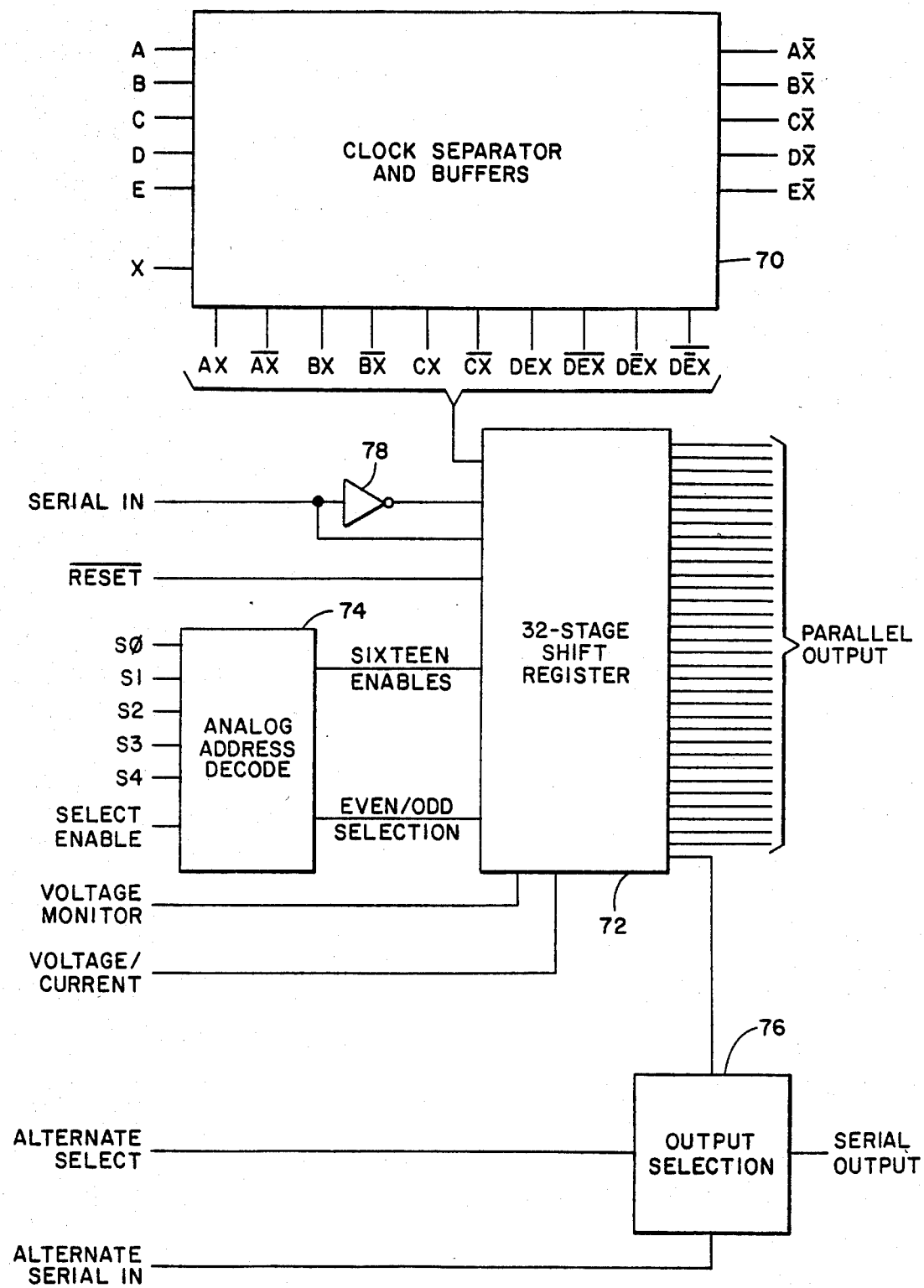
FIG. 4 shows a block diagram of the serial-parallel multiplexer (SPM) chip.

Referring to FIG. 4, each SPM chip 26–40 is comprised of the clock separator and buffer circuitry 70, a thirty two stage shift register 72 with a reset capability, analog select circuitry and analog address decode circuitry 74, output selection circuitry 76, and an inverter on the serial input 78. The function of each of these items is explained in the following paragraphs. The SPM chip is especially designed for use on the tester. It may be fabricated from a sub-set of the master slice used in the chips tested on the tester and is typically packaged in a sixty-four pin integrated circuit package.

Figure 5:
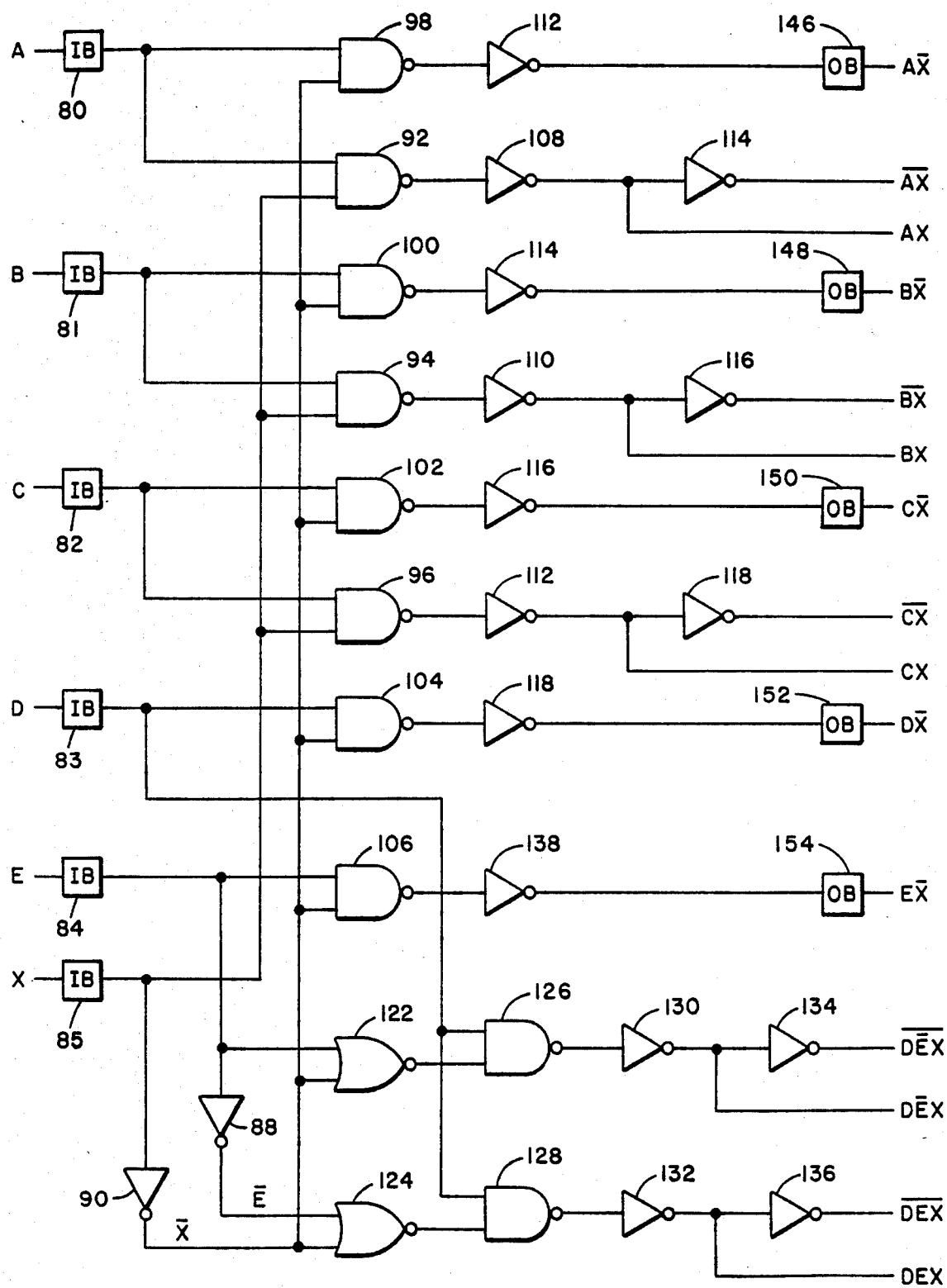
FIG. 5 is a schematic diagram of the SPM clock separator circuitry.

FIG. 5 is a schematic diagram of the clock separator and buffer circuitry 70. The following description uses an asterisk, *, to denote a logic signal that is true when its voltage level is low. For example, the signal R is true when high, while the signal R* is true when low. The use of the asterisk is identical to the use of a bar over a signal name on a circuit drawing. Since many signal names are a combination of individual signal names (for example, the signal AE is the result of the logical AND of signals A and E), parenthesis, ( ), are sometimes used with the asterisk to avoid ambiguity. Thus, (AE)* represents a signal that is true when both A and E are low, while A(E)* would represent the signal that is true when A is high and E is low.

All the input signals are buffered by the input buffers, IB, 80–85. The signals A, B, C, D, E, and X are clock signals that are decoded by the circuitry of the clock separator. The signals E and X are inverted by the inverters 88 and 90, respectively, to generate the signals E* and X*. The signals A, B, and C are gated with the signal E by the NAND-gates 92–96. The three inverters 108–112 invert the output of the three NAND gates to form the signals AX, BX, and CX. These three signals are inverted by the three inverters 114–118 to form the inversion of the signals AX, BX, and CX. The NOR-gate 122 gates the signals E and X* while the NOR gate 124 gates the signals E* and X*. The outputs of these two NOR-gates are gated with the signal D by the two NAND-gates 126 and 128. The output of the NAND-gates is inverted by the inverters 130–132 to form the signals D(E)*X and DEX. Two more inverters 134–136 generate the inversion of these two signals. All ten signals, AX, BX, CX, D(E)*X, DEX, and their inversions are used to control the operation of the SPM chip. The signals A, B, C, D, and E are gated with the signal X* by the NAND-gates 98–106. The outputs of the gates are inverted by the inverters 112–118 and 138 to form the clock signals A(X*), B(X*), D(X*), and E(X*). These five signals are buffered by the output buffers (OB) 146–154 and are used as the clock signals for the device under test (DUT). Only one of the eight SPMs is connected, at any given time, through the wiring of the SPM printed circuit board 22 and through the test fixture connector 54, to the paddle card 24 and the DUT 42.

Figure 6:
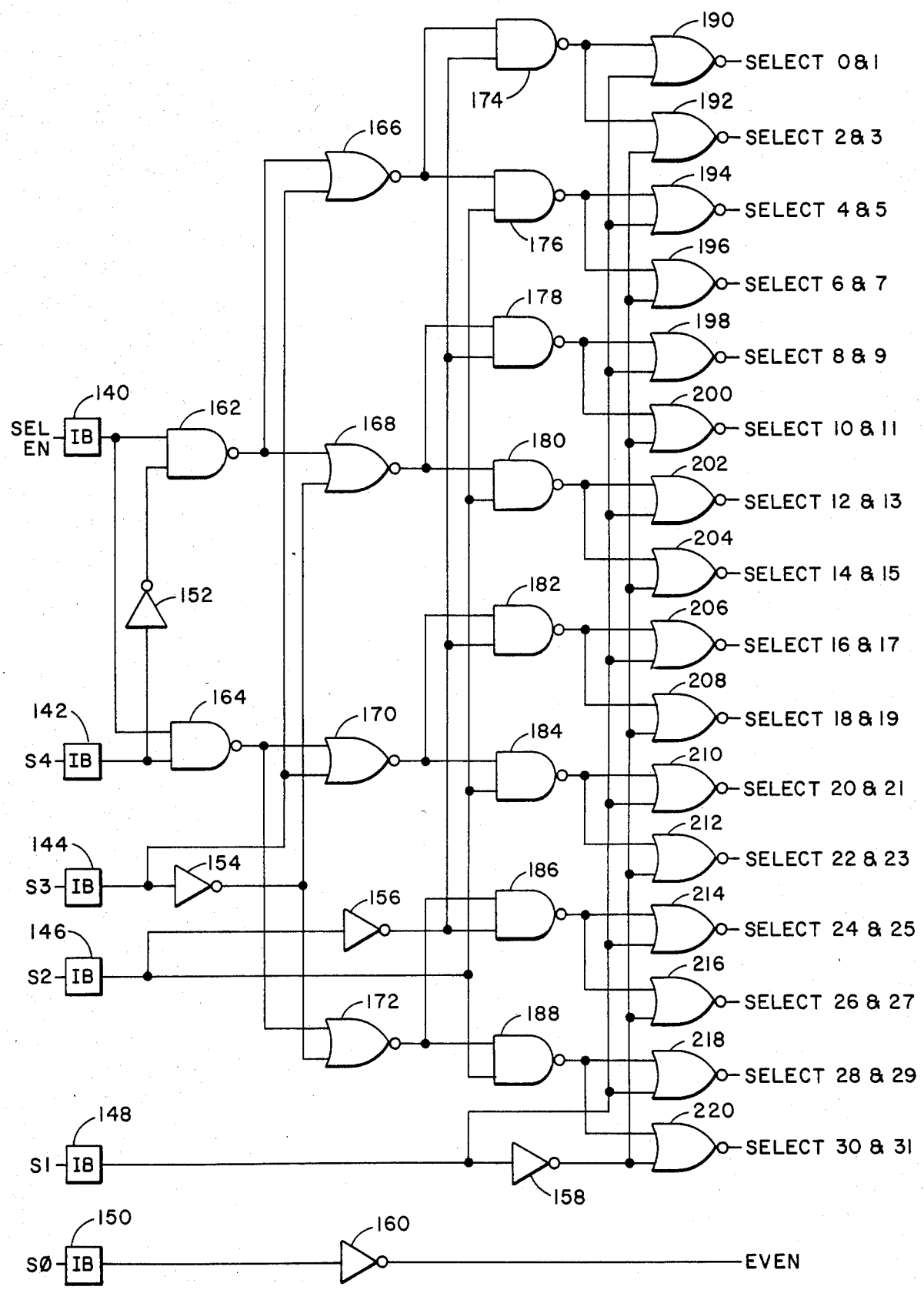
FIG. 6 is a schematic diagram of the SPM analog address decode circuitry.

FIG. 6 is a schematic diagram of the SPM analog address decode circuitry 74. This circuitry, when enabled, accepts a five bit binary address on lines S0–S4 and decodes them to generate sixteen select lines and an EVEN signal. The signals to the circuitry are buffered by the input buffers, IB, 140–150. The decode circuitry uses four input signals, S1–S4, and their complements, from the inverters 152–158, to generate one of the sixteen possible output signals.

Each gate in the decoding network feeds two gates where it is compared to another input signal and its complement. Thus, the NAND gates 162 and 164 compare the signal S4 and its complement to the signal SEL EN. The output of 162 goes to the input of the two NOR gates 166–168 while the output of 164 goes to the input of the two NOR gates 170–172. These four NOR gates compare the outputs of the two NAND gates with the signal S3 and its complement. The NOR gate outputs each go to inputs on two of the NAND gates 174–188 where they are compared to the signal S2 and its complement. The outputs of the eight NAND gates each go to an input on two of the NOR gates 190–220 for comparison to S1 and its complement. Each of the sixteen outputs of 190–220 are connected, within the SPM, to select circuitry within two shift register stages of the SPM.

The signal S0, after inversion by 160, is named EVEN. The state of this signal determines which one of the two stages selected by the one out of sixteen select outputs is to be used for DC parametric testing.

The signal SEL EN (select enable) is used to enable the address decode circuitry. If it is low, all sixteen of the select outputs will be low. The address decode circuitry is used to select one of the thirty two shift register outputs, and consequently one of the pins on the DUT, for DC parametric testing. The computer selects one of the eight SPMs by applying a high SEL EN signal and then puts the desired binary address on the inputs S0–S4.

Figure 7:
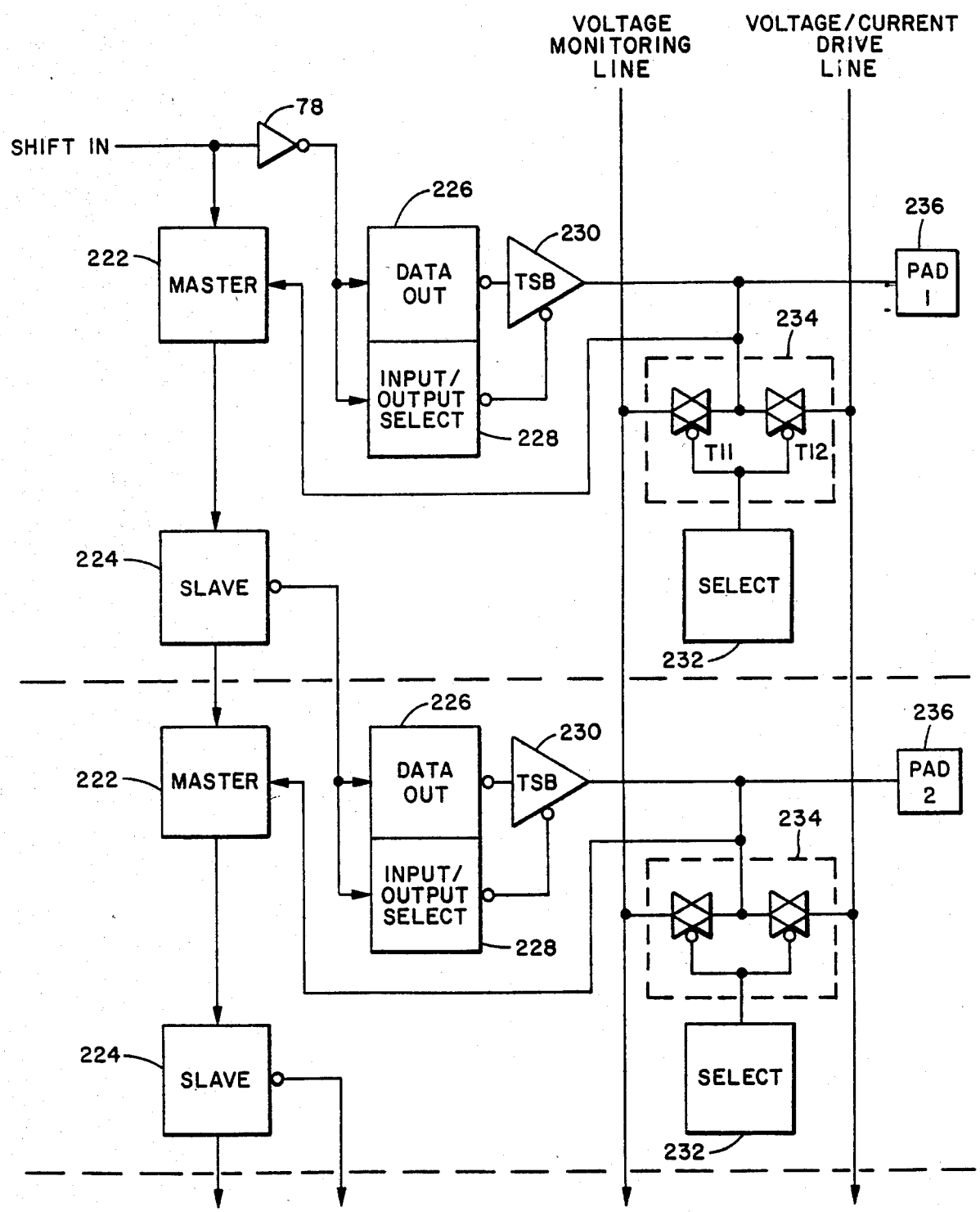
FIG. 7 is a block diagram showing two SPM shift register stages.
Figure 8:
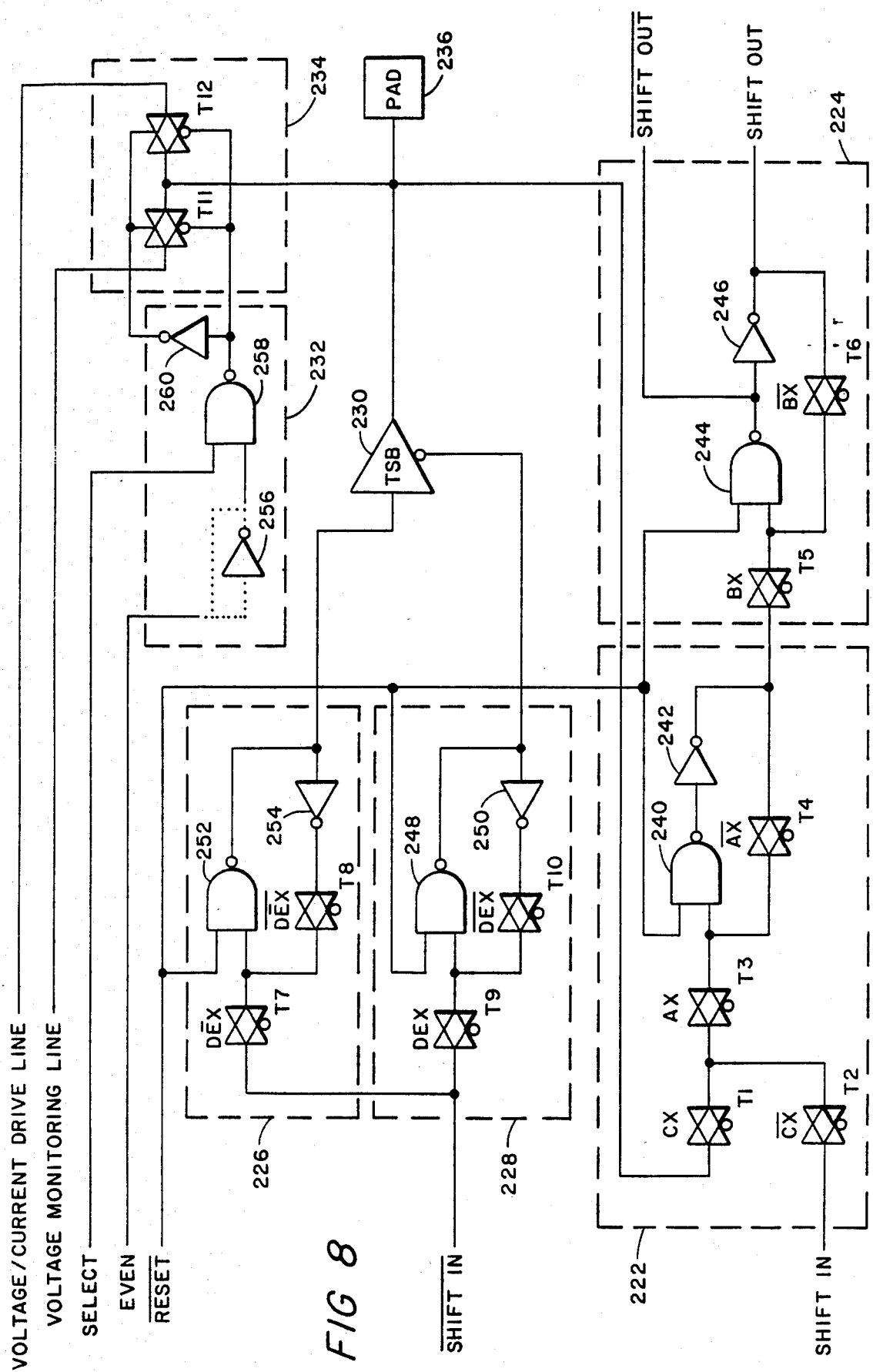
FIG. 8 is a schematic diagram of the circuitry of a SPM shift register stage.

The first two SPM shift register stages are shown in the block diagram on FIG. 7. A stage consists of a master latch 222, a slave latch 224, a data out latch 226, an input/output select latch 228, a tri-state buffer (TSB) 230, transmission gates 234, transmission gate select logic 232 and a pad 236. The details of each of these elements is shown in FIG. 8. The first stage is unique in that the data out latch and input/output select latch are connected to the inverter 78. All remaining 255-stages are identical to the second (lower) stage shown in FIG. 7.

The master 222 and slave 224 latches are one stage of the shift register. The input/output select latch 228 is used to enable or disable the tri-state buffer 230. On the last shift of the 256-bit pattern into the shift register, the data out latches 226 are loaded. If the pin of the DUT associated with the stage is an input, the tri-state buffer will be enabled and the output of the data out latch, through the TSB, will be applied to the pin of the DUT. The select logic 232 is used during DC parametric testing to connect the voltage/current driveline and voltage monitoring line to the selected pin of the DUT. Each stage is connected through a pad 236 to a pin of the IC package. The SPM printed circuit board wiring connects the pin to the test head connector which connects it to the DUT.

Referring to FIG. 8, the master latch 222 consists of four transmission gates T1–T4, a NAND gate 240 and an inverter 242 while the slave latch 224 has two transmission gates T5–T6, a NAND gate 244 and inverter 246. The transmission gates are always used in pairs with clock signals from the clock separator circuitry shown in FIG. 5 controlling their operation. A clock signal and its complement control the pair such that when one transmission gate of the pair is turned on, the other is turned off. When the clock signal shown above each transmission gate is low, the gate will be turned on.

The master latch is loaded with the binary signal SHIFT IN by turning on T2 and T3 and turning off T1 and T4 with the clock CX high and AX low. The clock signals are then reversed, turning off T2 and T3 and turning on T1 and T4. The input data is now latched in the master latch. The data is then transferred to the slave latch 224 by turning on T5 and turning off T6 and then turning off T5 while turning on T6. The master-slave arrangement is used to prevent the input signal from passing through to subsequent stages. The SHIFT OUT and (SHIFT OUT)* signals become the SHIFT IN and (SHIFT IN)* signals, respectively of the next stage, as shown in FIG. 7.

The input/output select latch 228, consisting of transmission gates T9–T10, NAND gate 248 and inverter 250, is operated in the same manner as the slave latch except the clock signal DEX and its complement control its operation. When the output of this latch is low, the tri-state buffer 230 is enabled and the output of the data out latch 226 is applied to a pin of the DUT.

The data out latch 226, consisting of transmission gates T7–T8, NAND gate 252 and inverter 254, is identical to the input/output select latch except its operation is controlled by the clock signal D(E*)X and its complement. This latch holds the signal that will be applied to the pin of the DUT if the tristate buffer is enabled.

FIG. 9 shows the timing of the clock signals used to control the operation of the SPM. They are explained in the following paragraphs with reference to the circuitry shown in FIG. 8.

PHASE 1, 3 and 6 show the timing of the clock signals used to shift data through the shift register. Transmission gate T2 is always turned on since the signal C is low. During time t1, the SHIFT IN signal from the previous shift register stage is applied to the input of the master latch since transmission gate T3 is turned on and T4 is turned off. During time t2, transmission gate T3 is off and T4 is turned on, latching the SHIFT IN signal in the master latch. During time t3, the signal is transferred to the slave latch, since transmission gate T5 is turned on and T6 is turned off. During time t4, the signal is latched in the slave latch when T5 turns off and T6 turns on.

PHASE 2 shows the timing of the clock signals used to transfer data from the shift register to the input/output selection latch. During the time t2, the (SHIFT IN)* signal from the previous stage of the shift register is applied to the input of the latch since transmission gate T9 is turned on. At the end of time t2, transmission gate T9 turns off and T10 turns on, latching the signal in the latch. The times t1 and t2 are necessary to insure that the signal is not transferred to the data out latch.

PHASE 4 shows the timing of the clock signal used to transfer data from the shift register to the data out latch. During time t1, the (SHIFT IN)* signal from the previous stage of the shift register is applied to the input of the latch since transmission gate T7 is turned on and T8 is turned off. At the end of t1, the signal is latched in the latch when T7 turns off and T8 turns on.

PHASE 5 shows the timing of the clock signals used to transfer data from the pads to the shift register stages. During the entire time t6, the transmission gate T1 is turned on and T2 is turned off. During the time t1, the signal on the pad is applied to the master latch input since transmission gate T3 is turned on. During the time t4, transmission gate T5 is turned on and the signal is also applied to the input of the slave latch. After time t4, transmission gates T3 and T5 are turned off while T4 and T6 are turned on, latching the signal in both the master and slave latch.

The operation of the SPM during functional test can now be explained. First, the input/output select latches 228 are programmed to agree with the inputs of the DUT 42. This is done by shifting a pattern of logical ones and zeros into the first 255 stages of the master-slave latches that make up the 256-stage shift register using repetitive cycles of the PHASE 1 timing pulses of FIG. 9.

When the 256th bit of the pattern is applied to the input of the first stage, the timing pulses of PHASE 2 of FIg. 9 are used to load the input/output select latch. Each input/output select latch except the first is loaded with the (SHIFT OUT)* signal from the previous stage of the shift register. The first input/output select latch is loaded with the complement of the input. IF the input-/output latch is loaded wth a one, the tristate buffer will be enabled and the corresponding pin on the DUT is an input. This selection will remain in effect for the entire functional test.

Individual test patterns are then shifted into the SPM shift register, using repetitive cycles of the PHASE 3 timing pulses of FIG. 9, and when the last bit is on the input, the clocking is changed to load the 256 data out latches. This is done by use of the timing pulses of PHASE 4 of FIg. 9.

The clock signals A(X*), B(X*), C(X*), D(X*) and E(X*), generated by the clock separation circuitry shown in FIG. 5, are then used to convert the internal registers of the DUT 42 into a shift register and shift a test pattern into it. The pattern in the internal registers is shifted back to the computer after the test using the above control signal and the output selection circuitry shown in FIG. 10.

The output pattern of the DUT 42 is then read into the shift register, by means of the timing pulses of PHASE 5 of FIG. 9, by turning on T1 and T3 and turning off T4, then turning on T4 and turning off T1 and T3 to load the master. The data is then transferred to the slave latch. If a pin on the DUT is an input, the signal applied to the input through the tri-state buffer will be loaded into the associated stage of the shift register. Thus the pattern shifted back to the computer from the SPM shift register after each functional test consists of the input pattern, from the data out latches, and the output pattern from the DUT 42.

This design gives the SPM a unique test capability that allows all the circuitry of the SPM associated with functional testing to be quickly self-tested. For example, with no DUT in place, a pattern of zeros is shifted out and loaded into the input/ouput latches, enabling all 256 tri-state buffers. Then a pattern of ones is shifted out and loaded into the data out latches. This is followed by a pattern of zeros to clear the shift register stages. The contents of the data out latches are then read into the shift register and shifted back to the computer. If all the bits are not a one, the defective SPM is easily determined. The remaining circuitry of each SPM can be tested by selecting the pads, one at a time, and forcing a voltage on the Voltage/Current Drive line while measuring that voltage by means of the Voltage Monitoring line.

A RESET* signal is used to reset the four latches associated with one shift register stage. All clock signals are first removed so that the latches will be in a latched condition. When the RESET* signal goes low, an input on each of the NAND gates in the four latches will go low. This causes the other input of the NAND gate to go low and the latches remain reset when the RESET* signal goes high.

Parametric testing is performed by utilizing the select circuitry 232, and the two transmission gates 234. The select circuitry 232 consists of an optional inverter 256, a NAND gate 258, and an inverter 260. This circuitry is used to select one of the thirty two pins of an SPM, and hence a pin on the DUT, for DC parametric testing. The SELECT signal is one of the sixteen select signals generated by the SPM analog address decode circuitry shown in FIG. 6. Each of the sixteen signals go to two stages on the SPM chip, an even numbered one and an odd numbered one. The signal EVEN is also generated by the circuitry shown in FIG. 6 and is true if the desired address is an even number. The inverter 256 (FIG. 8) is optional and is shown connected by a dotted line with a dotted line around it. If the stage of the SPM is an odd numbered stage, the inverter is connected to the NAND gate by the wiring represented by the lower dotted line. If the stage is an even numbered stage, the inverter is not used and the wiring represented by the upper dotted line connects the signal EVEN directly to the input of the NAND gate. When a stage is selected by the correct combination of SELECT and EVEN, the two transmission gates T11 and T12 are turned on.

The two transmission gates 234 connect the voltage/-current drive line and the voltage monitoring line to the pad 236 and hence to a pin of the DUT for DC parametric testing. If the pin of the DUT is an input, a voltage is forced on the voltage/current drive line and a current is monitored on the voltage monitoring line; the current is measured by determining the voltage drop across a precision resistor on the INTF (interface) board 20. The voltage is varied from zero to a positive value, while monitoring the current, to determine the N-transistor turn-on voltage and then varied from the maximum allowable input value downward, while monitoring the current, to determine the P-transistor turn-on voltage. As either of the transistors turn on, the current increases dramatically so that the turn-on point can be readily measured. If the DUT pin is an output, a current is forced into each output when the output is low, and out of each output when it is high. The voltage is measured at each current and the sloped, V/I, of both the P and N transistors, is calculated.

Delay testing is performed by utilizing the shift register around the periphery of the DUT as a ring oscillator. The ring oscillator concept is described in co-pending patent application, Ser. No. 389,573, filed June 17, 1982, assigned to the same assignee as this patent application. In addition, the internal registers of the DUT are wired such that they can be converted to a ring oscillator. They are tested as a ring oscillator during delay test in the same manner as the ring oscillator around the periphery of the chip.

Figure 10:
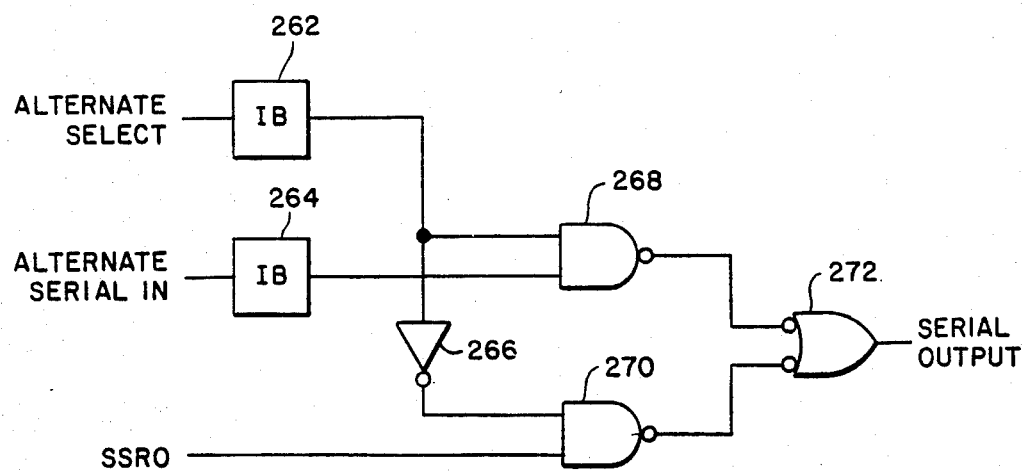
FIG. 10 is a schematic diagram of the SPM output selection circuitry.

Referring to FIG. 10, the SPM output selection circuitry 76 is shown. This circuitry consists of the input buffers, IB, 262–264, an inverter 266, two NAND gates 268–270, and an inverted input OR gate 272. Two signals, ALTERNATE SELECT and ALTERNATE SERIAL IN are buffered by the input buffers since they originate off of the SPM chip. The signal SSRO (Serial Shift Register Output) is the output of the 32-stage shift register on the SPM chip. The signals ALTERNATE SELECT, a control signal from the tester computer, and ALTERNATE SIGNAL IN, the output of the shift registers of the DUT, are only connected to the eighth SPM by the wiring of the SPM printed circuit board. The ALTERNATE SELECT signal is used to determine whether the output of the 256 stage SPM shift register or the output of the shift registers of the DUT will be shifted back to the tester computer as the signal serial output.

We claim:

1. A test fixture for use with VLSI chips comprising:
computing means for defining and controlling a set of selectable tests that are to be performed on a VLSI chip; and
fixture means for receiving and holding said VLSI chip, said VLSI chip having at least 150 I/O pins, said fixture means including a test stand and a circuit board mounted to said test stand, said VLSI chip being detachably coupled to said circuit board, said fixture means further including means for transferring test signals and data between said computing means and said fixture means, said fixture means comprising:
mounting means for detachably holding said VLSI chip within said fixture means such that electrical contact may be selectively made with all of the I/O pins of said chip, said mounting means including
a paddle card to which the VLSI chip to be tested may be mounted, said paddle card having pin connection means for making electrical contract between each I/O pin of the VLSI chip and a respective pin contact point positioned on said paddle card,
connector means for making simultaneous electrical contact between each pin contact point of the paddle card and a respective I/O contact point of said circuit board, said connector means comprising
a test head adapted to be placed between said circuit board and said paddle card such that a receiving channel of said test head is positioned over said I/O contact points of the circuit board and said pin contact points of the paddle card and
connection strips inserted into said receiving channel, said connection strips having spaced-apart insulated wires therein that lie substantially orthogonal to said circuit board and said paddle card, and
holding means for detachably positioning and holding said paddle card under pressure against said connector means, whereby a first tip of each of said wires makes contact with a desired I/O contact point of the circuit board at the same time that a second tip of said wire makes contact with a corresponding pin contact point of the paddle card whenever said holding means holds the paddle card under pressure against the test head, and
register means mounted to said circuit board for controllably transferring said test signals and data to or from desired I/O contact points of said circuit board, whereby said test signals and data may be transferred to desired I/O pins of said VLSI chip under control of said computing means.

2. A VLSI chip tester as defined in claim 1 wherein said register means comprises:
receiver/driver means for receiving, driving, and terminating said test signals and data as said test signals and data are passed between said fixture means and said computing means; and
a plurality of shift registers coupled between said receiver/driver means and said mounting means, each shift register including a plurality of stages that may be selectively programed to receive or transmit data.

3. A VLSI chip tester as defined in claim 2 wherein each stage of each shift register is electronically connected to an I/O contact point corresponding to one of the I/O pins of the VLSI chip to be tested.

4. A VLSI chip tester as defined in claim 3 wherein said fixture means further includes:
a test stand; and
a circuit board mounted to said test stand, said circuit board having said receiver/driver means, shift registers and I/O contact points mounted thereto, and further having electrical connection means for selectively interconnecting said receiver/driver means, shift registers, and I/O contact points.

5. A VLSI chip tester as defined in claim 4 wherein said connection strips are made from a non-conductive semi-resilient material, such as silicone rubber, that has said wires inserted thereinto at a desired spacing, whereby said non-conductive semi-resilient material deforms slightly under the pressure of the holding means, thereby ensuring that the tips of the wires are sufficiently exposed to make good electrical contact with said I/O contact points and said pin contact points.

6. A VLSI chip tester as defined in claim 5 wherein the VLSI chip to be tested has at least 256 I/O pins.

7. A VLSI chip tester as defined in claim 3 wherein test data to be transferred to or from the computing means may be shifted serially into or out of said shift registers, and further wherein said test data to be transferred to or from the VLSI chip under test may be shifted in parallel into or out of said shift registers.

8. A VLSI chip tester as defined in claim 7 wherein a clock signal generated by said computing means may be selectively decoded and used to control said register means or applied to the VLSI chip under test to shift test data patterns into or out of internal circuitry located within said VLSI chip.

9. A VLSI chip tester as defined in claim 8 further including self-test means for generating test signals and data that self test said VLSI chip tester.

* * * * *